(12) United States Patent
Chen et al.

(10) Patent No.: US 10,716,398 B1
(45) Date of Patent: Jul. 21, 2020

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Kai-Wen Yu, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/550,307

(22) Filed: Aug. 26, 2019

(30) Foreign Application Priority Data

May 6, 2019 (TW) .............................. 108115826 A

(51) Int. Cl.
*A47B 88/44* (2017.01)
*A47B 88/443* (2017.01)
*A47B 88/447* (2017.01)

(52) U.S. Cl.
CPC ............ *A47B 88/44* (2017.01); *A47B 88/443* (2017.01); *A47B 88/447* (2017.01); *A47B 2210/007* (2013.01)

(58) Field of Classification Search
CPC ... A47B 88/407; A47B 88/0407; A47B 88/44; A47B 88/40; A47B 88/443; A47B 88/447; A47B 88/473; A47B 88/477; A47B 88/50; A47B 88/53; A47B 88/57; A47B 88/16; A47B 2088/0444; A47B 2088/4235; A47B 2210/0086; A47B 2210/0089; A47B 2210/0016; A47B 2210/0018; A47B 2210/0064; A47B 2210/0067; A47B 2210/007; A47B 2210/0081

See application file for complete search history.

(56) References Cited

U.S. PATENT DOCUMENTS

| 3,589,778 | A  | * | 6/1971  | Olson | ..................... | F16C 29/02 |
| | | | | | | 384/21 |
| 7,520,577 | B2 | * | 4/2009  | Chen  | ..................... | A47B 88/493 |
| | | | | | | 312/333 |
| 7,708,359 | B2 | * | 5/2010  | Peng  | ..................... | A47B 88/57 |
| | | | | | | 312/334.44 |
| 8,585,164 | B2 | | 11/2013 | Chen  | | |
| 9,629,459 | B2 | | 4/2017  | Chen  | | |
| 9,681,749 | B2 | | 6/2017  | Chen  | | |
| 9,992,906 | B2 | | 6/2018  | Chen  | | |

(Continued)

FOREIGN PATENT DOCUMENTS

CN 102846046 A 1/2013

*Primary Examiner* — Andrew M Roersma
(74) *Attorney, Agent, or Firm* — Winston Hsu

(57) ABSTRACT

A slide rail assembly comprises a first rail, an engaging member, a second rail and a locking member. The engaging member is arranged on the first rail and comprises a resilient portion. The second rail is movable relative to the first rail. The locking member is movably mounted on the second rail. When the second rail at a first position moves to a second position in a first direction relative to the first rail, the locking member locks with the resilient portion of the engaging member to prevent the second rail at the second position from moving in a second direction.

18 Claims, 14 Drawing Sheets

(56) References Cited

U.S. PATENT DOCUMENTS

| | | |
|---|---|---|
| 10,041,535 B2 | 8/2018 | Chen |
| 10,244,868 B2 | 4/2019 | Chen |
| 2003/0197453 A1 | 10/2003 | Jurja |
| 2007/0164644 A1 | 7/2007 | Hwang |
| 2011/0135224 A1 | 6/2011 | Chen |
| 2018/0070723 A1* | 3/2018 | Chen .................... A47B 88/493 |
| 2018/0295992 A1 | 10/2018 | Chen |

* cited by examiner

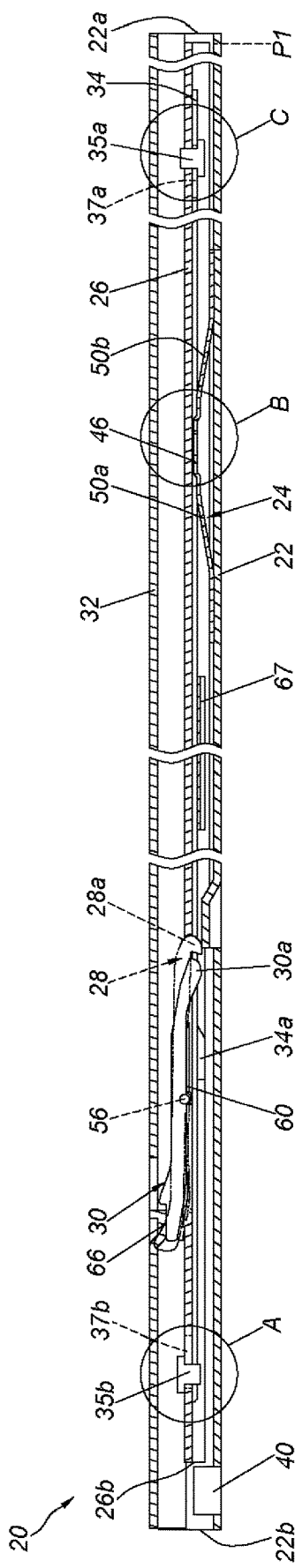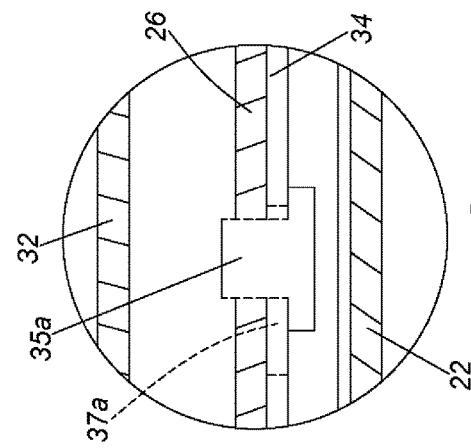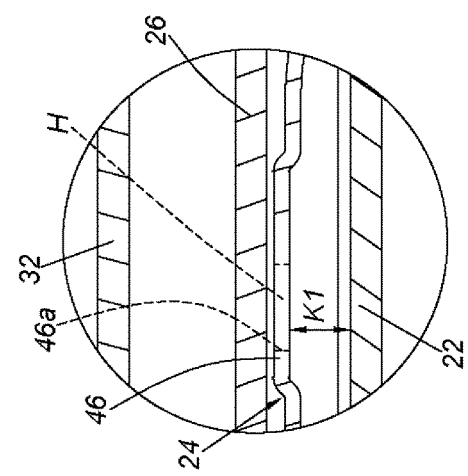

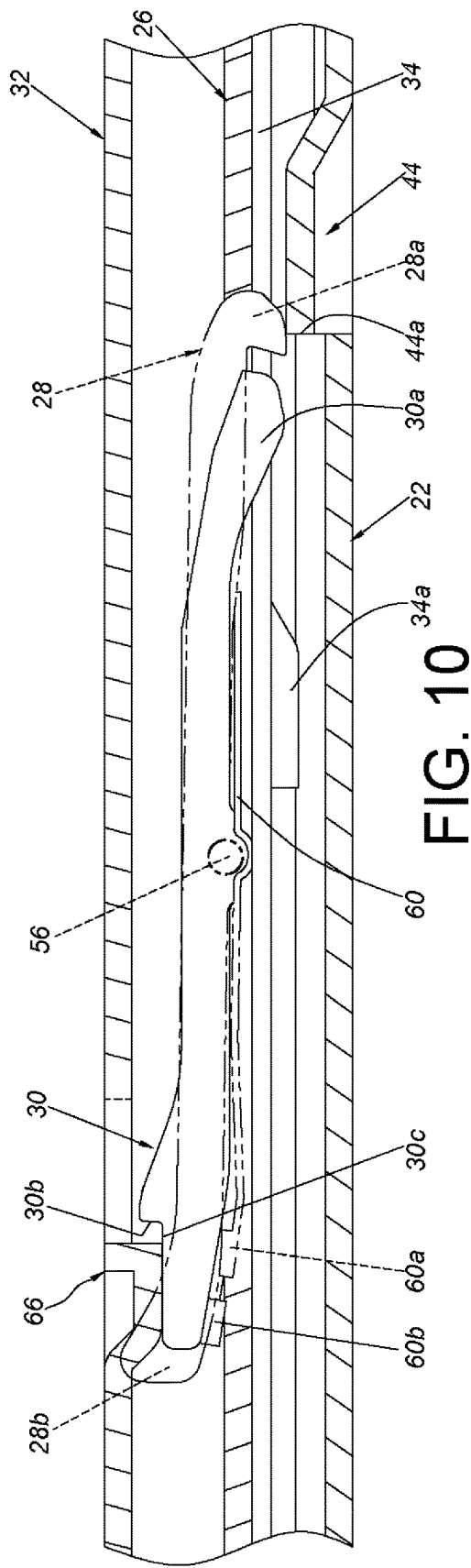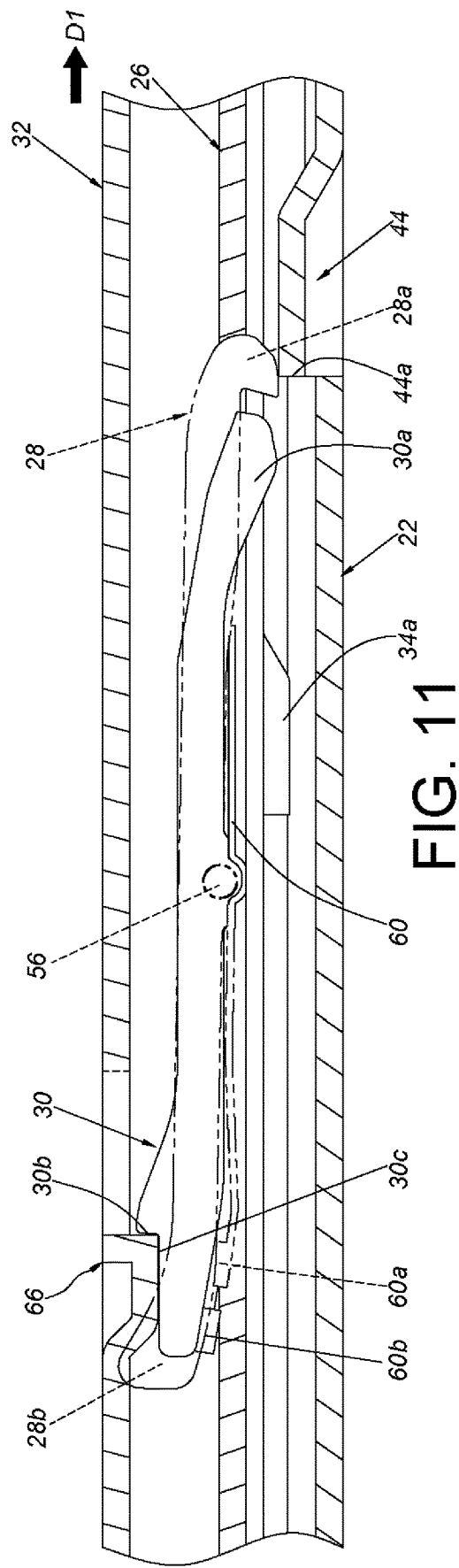

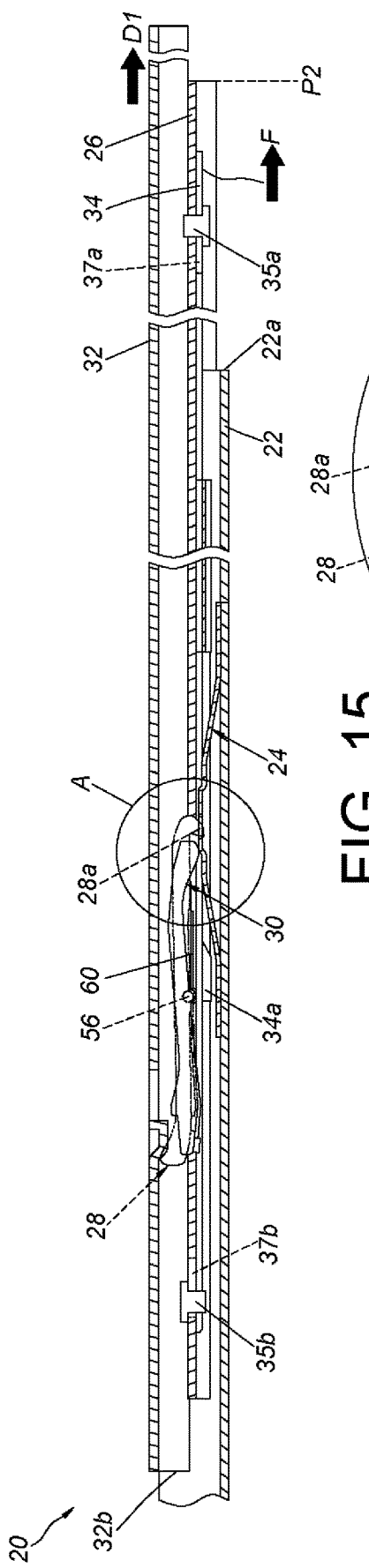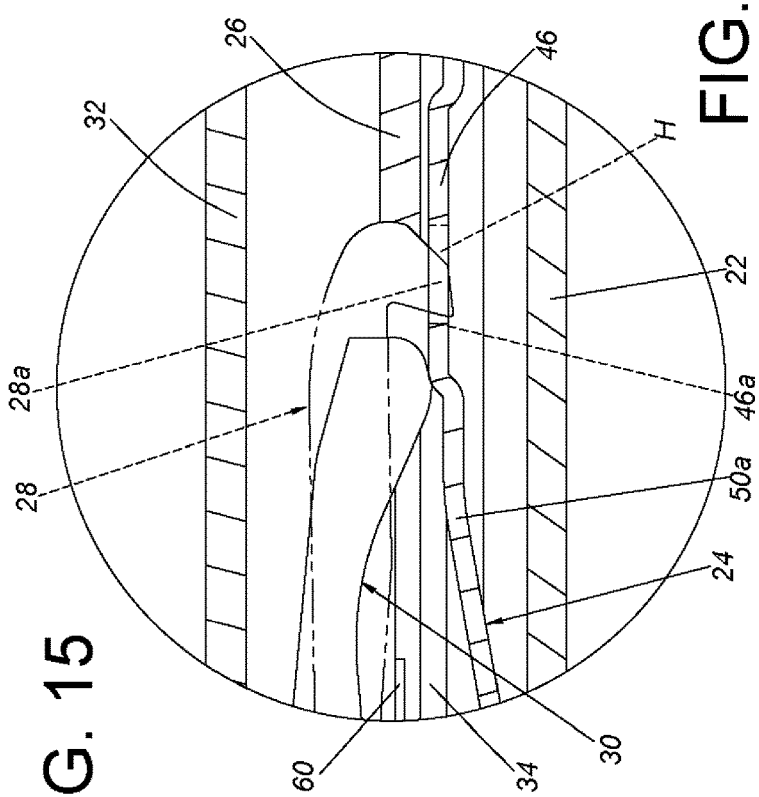

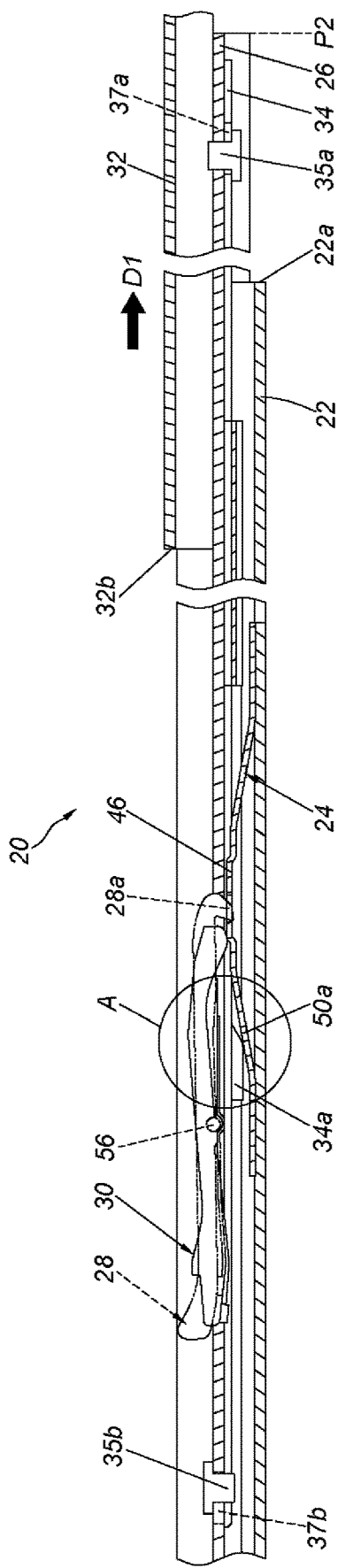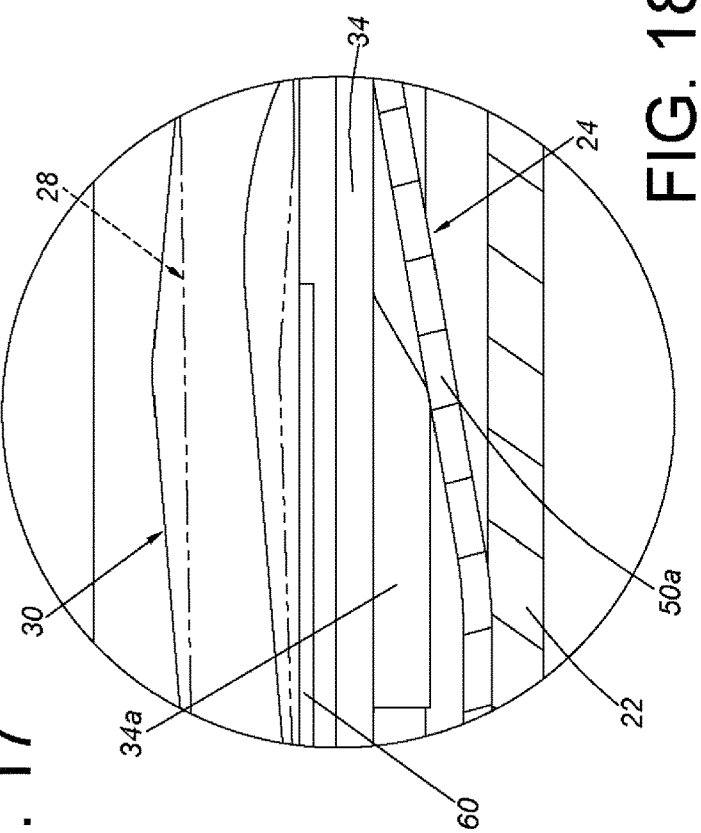

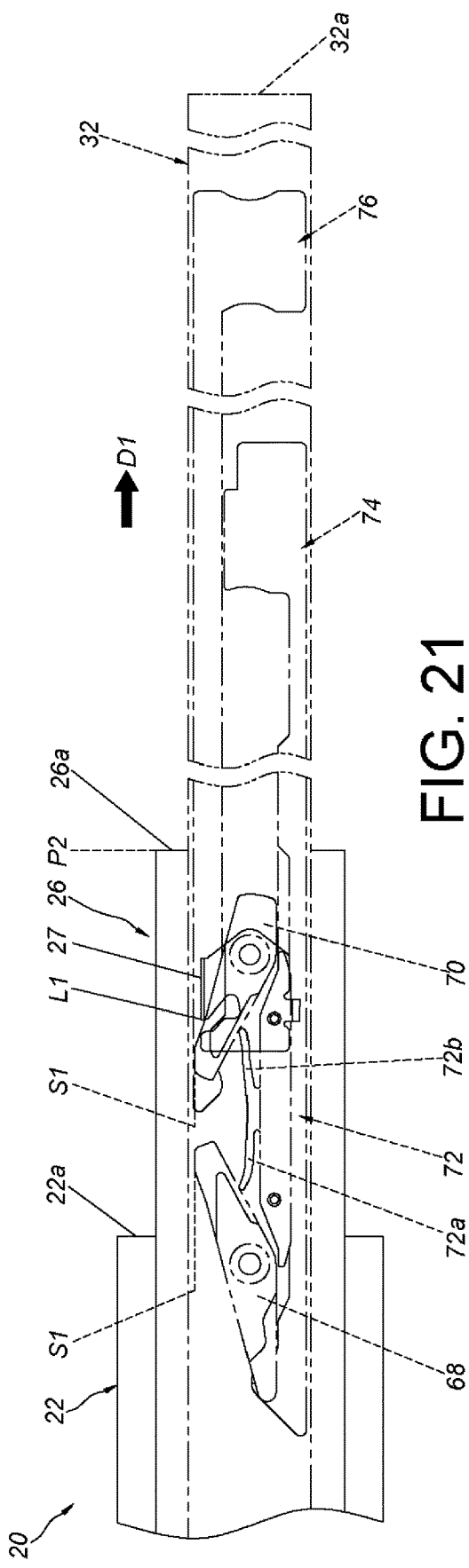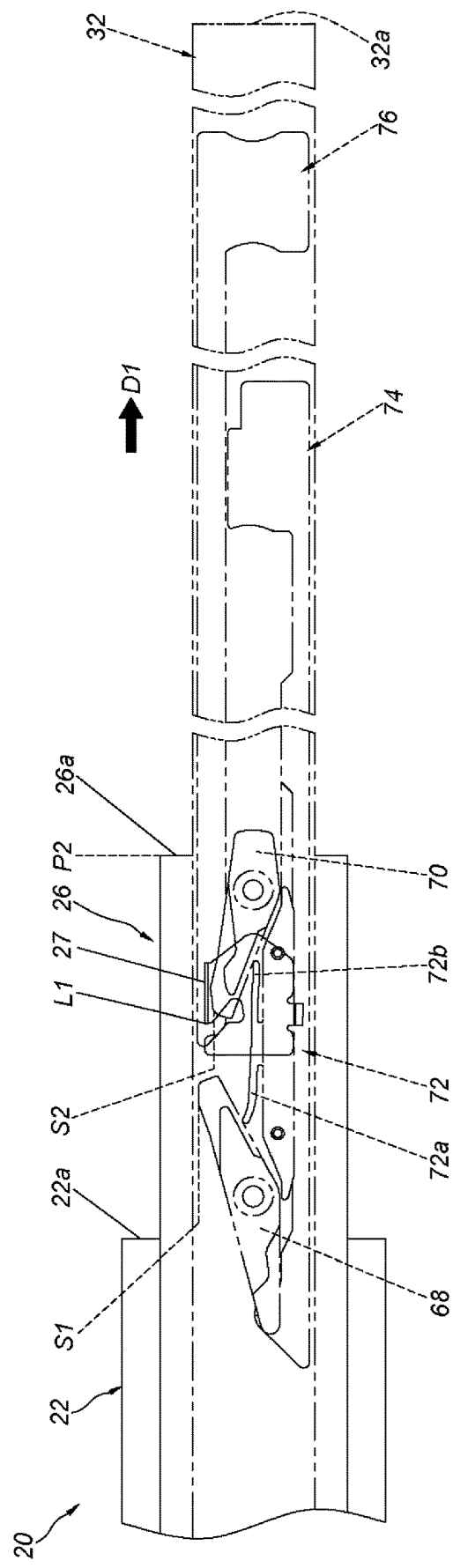

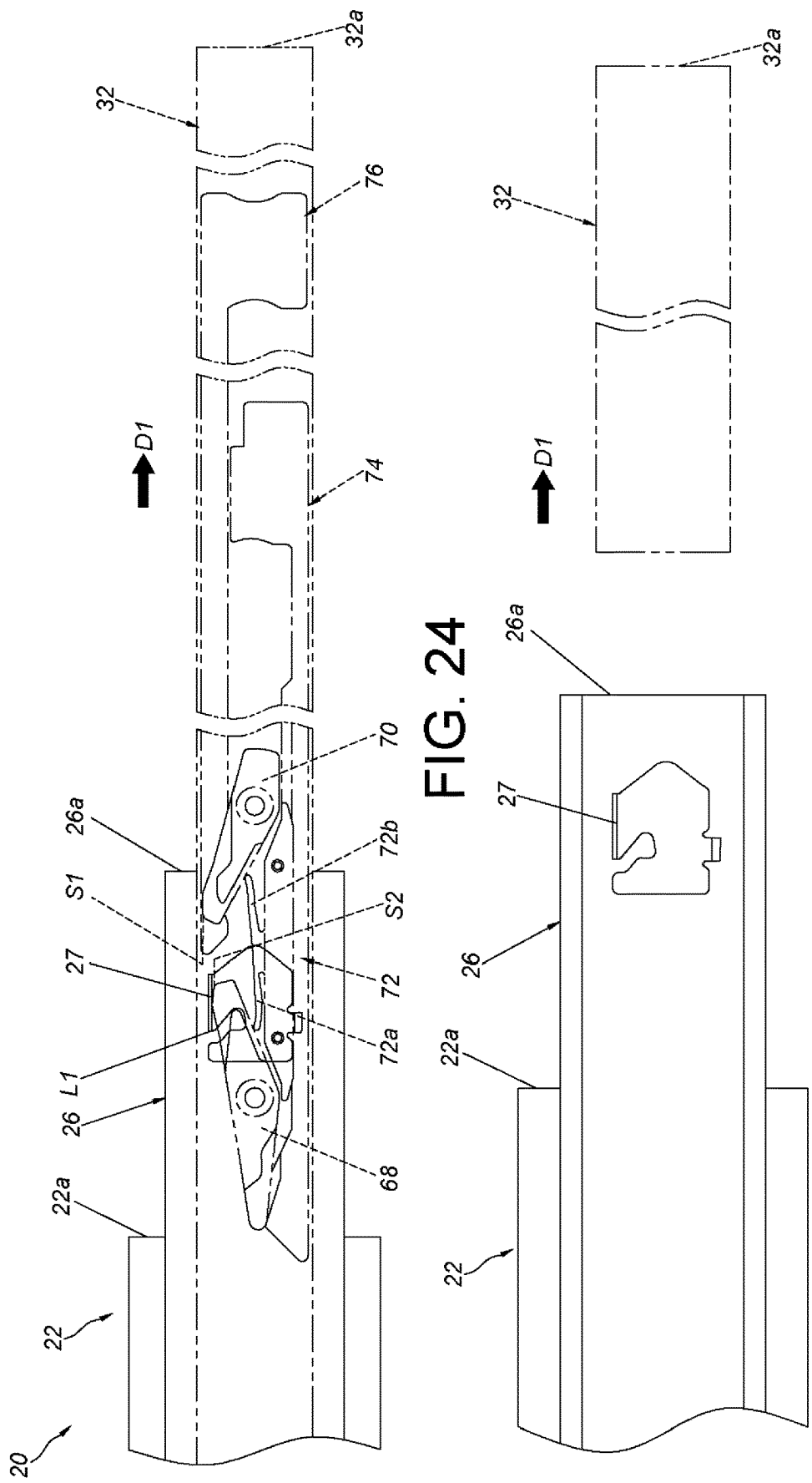

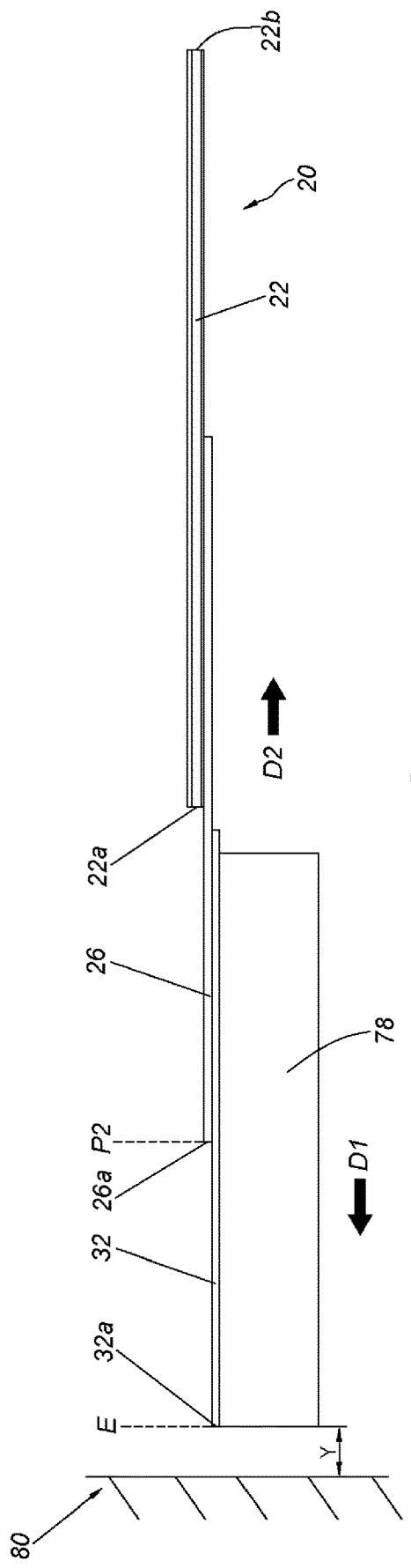
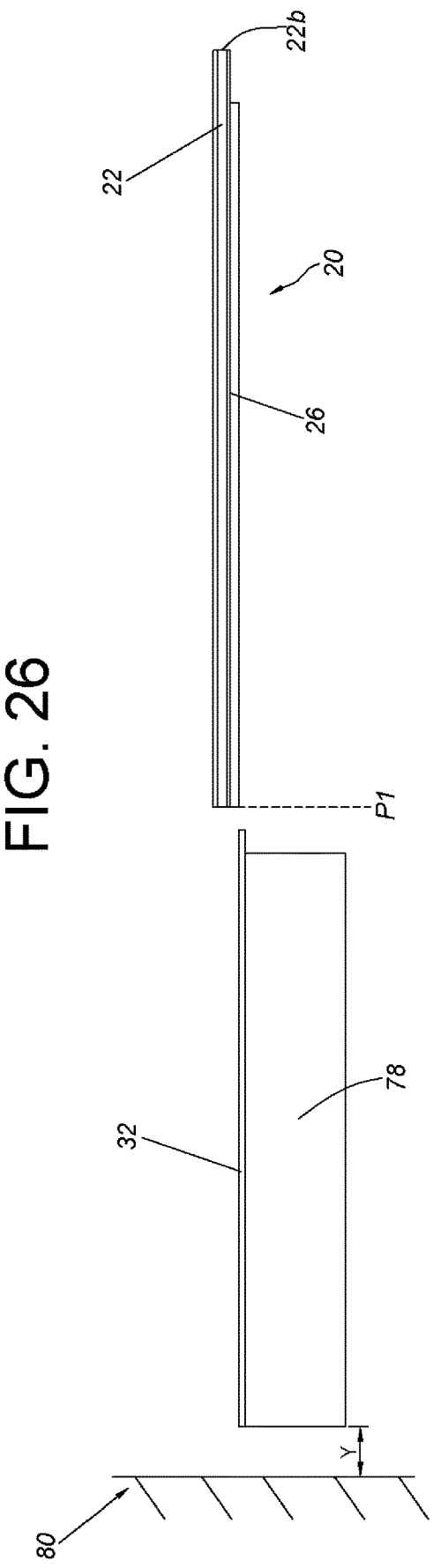

SLIDE RAIL ASSEMBLY

BACKGROUND OF THE INVENTION

1. Field of the Invention

The present invention relates to a slide rail, and more particularly, to a slide rail assembly that can be applied within a narrow space with a locking mechanism between two rails that can be easily operated to release the slide rail assembly.

2. Description of the Prior Art

U.S. Pat. No. 10,041,535 B2 discloses a slide rail assembly comprising a first rail, a second rail, a third rail, a locking mechanism, a blocking feature and an operating member, wherein the second rail can be locked with the blocking feature of the first rail via the locking mechanism when the second rail is at an extension position (as shown in FIG. 10 of the patent). Furthermore, the locking member of the locking mechanism can be driven via an applied force on the operating member to release a lock of the locking mechanism on the blocking feature of the first rail. Wherein, a protruding structure fixedly attached to or formed on the first rail is illustrative of an example of the blocking feature.

However, as market demands vary, developing a different slide rail product has become an important topic.

SUMMARY OF THE INVENTION

The present invention provides a slide rail assembly with a locking mechanism easily operable within a narrow space, wherein the locking mechanism is used to release the slide rail assembly.

According to an aspect of the present invention, a slide rail assembly comprises a first rail, an engaging member, a second rail and a locking member. The engaging member is arranged on the first rail and comprises a resilient portion. The second rail is movable relative to the first rail, and the locking member is movably mounted on the second rail; wherein, when the second rail moves from a first position to a second position in a first direction relative to the first rail, the locking member is used to lock with the resilient portion of the engaging member such that the second rail at the second position is prevented from moving in a second direction opposite to the first direction.

Preferably, the first rail comprises a first wall, a second wall, and a longitudinal wall connected between the first wall and the second wall of the first rail, and the resilient portion of the engaging member has a height relative to the longitudinal wall of the first rail.

Preferably, the engaging member further comprises a first connecting portion and a second connecting portion mounted on the longitudinal wall of the first rail, and the resilient portion is connected between the first connecting portion and the second connecting portion.

Preferably, the engaging member further comprises a first guiding portion and a second guiding portion, and two ends of the resilient portion are connected to the first connecting portion and the second connecting portion via the first guiding portion and the second guiding portion, respectively.

Preferably, the slide rail assembly further comprises a synchronizing member and a third rail. The synchronizing member is movably mounted to the second rail, and the third rail is movable relative to the second rail. The third rail is able to drive the second rail from the first position to the second position via the synchronizing member, wherein when the second rail is driven for a predetermined range, the synchronizing member is driven via a guiding portion adjacent to the resilient portion of the engaging member such that the third rail and the second rail no longer move synchronously.

Preferably, the slide rail assembly further comprises an operating member arranged on the second rail; wherein, when the second rail is at the second position, the operating member is operated to drive the resilient portion of the engaging member such that the locking member no longer locks with the resilient portion of the engaging member.

Preferably, the locking member and the synchronizing member are pivotally connected to the second rail, and the slide rail assembly further comprises a resilient member attached to the second rail. The resilient member has a first resilient leg and a second resilient leg that provides an elastic force to the locking member and the synchronizing member, respectively.

Preferably, the first rail further comprises a blocking feature, and when the second rail is at a predetermined position relative to the first rail, the second resilient leg is able to provide the elastic force to the synchronizing member such that the synchronizing member is blocked by the blocking feature, thereby preventing the second rail at the predetermined position from moving in the first direction.

Preferably, the third rail has a corresponding feature, and the corresponding feature of the third rail is used to engage the synchronizing member.

Preferably, the second rail comprises a blocking structure, and the slide rail assembly further comprises a working member movably mounted to the third rail. When the second rail is at the second position and the third rail moves to an extension position relative to the second rail in the first direction, the working member is at a first status and located on a side of the blocking structure to prevent the third rail from continuing to move in the first direction.

Preferably, the slide rail assembly further comprises a base having an elastic portion that provides an elastic force to keep the working member at the first status, and a releasing member operably connected to the working member; the releasing member is used to drive the working member from the first status to a second status.

According to another aspect of the present invention, a slide rail assembly comprises a first rail, an engaging member, a second rail, a locking member, a synchronizing member, and a third rail. The engaging member is arranged on the first rail and comprises a resilient portion and a guiding portion. The second rail is movable relative to the first rail. The locking member and the synchronizing member are pivotally connected to the second rail via a common axis; and the third rail is movable relative to the second rail. Wherein, the third rail is able to drive the second rail from a first position to a second position in a first direction via the synchronizing member. When the second rail is driven for a predetermined range, the synchronizing member is driven via the guiding portion of the engaging member such that the third rail and the second rail no longer move synchronously, and when the second rail is at the second position, the locking member is used to lock with the resilient portion of the engaging member.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 is a diagram illustrating the slide rail assembly being at a retracted status according to the embodiment of the present invention.

FIG. 7 is a diagram illustrating an enlarged area A of FIG. 6.

FIG. 8 is a diagram illustrating an enlarged area B of FIG. 6.

FIG. 9 is a diagram illustrating an enlarged area C of FIG. 6.

FIG. 10 is a diagram of a partially enlarged view of FIG. 6 illustrating a part of the third rail that has yet to contact the synchronizing member of the second rail.

FIG. 11 is a diagram according to the embodiment of the present invention illustrating the part of the third rail that has contacted the synchronizing member of the second rail to allow the second rail and the third rail to synchronously move in the first direction relative to the first rail.

FIG. 15 is a diagram according to the embodiment of the present invention illustrating the second rail of the slide rail assembly being at a second position relative to the first rail, and the third rail being able to move in the first direction relative to the second rail.

FIG. 16 is a diagram illustrating an enlarged area A of FIG. 15.

FIG. 17 is a diagram according to the embodiment of the present invention illustrating the second rail of the slide rail assembly being at the second position relative to the first rail, and the operating member being operable so that an unlocking feature contacts the engaging member.

FIG. 18 is a diagram illustrating an enlarged area A of FIG. 17.

FIG. 21 is a diagram according to the embodiment of the present invention illustrating the second rail of the slide rail assembly being at the second position relative to the first rail, and the third rail moving in the first direction relative to the second rail.

FIG. 22 is a diagram according to the embodiment of the present invention illustrating the second rail of the slide rail assembly being at the second position relative to the first rail, and the third rail continuing to move in the first direction relative to the second rail.

FIG. 24 is a diagram according to the embodiment of the present invention illustrating the second rail of the slide rail assembly being at the second position relative to the first rail, and a working member of the third rail being unlocked from a blocking structure of the second rail so that the third rail at the extension position can move further in the first direction.

FIG. 25 is a diagram according to the embodiment of the present invention illustrating the second rail of the slide rail assembly being at the second position relative to the first rail, and the third rail being removed from the second rail.

FIG. 26 is a diagram according to the embodiment of the present invention illustrating the slide rail assembly being applied within a narrow space, and the slide rail assembly being at the extended status.

FIG. 27 is a diagram according to the embodiment of the present invention illustrating the slide rail assembly being applied within the narrow space, and the second rail being retracted in the second direction relative to the first rail so that the third rail can be removed from the second rail.

DETAILED DESCRIPTION

Figure 1:
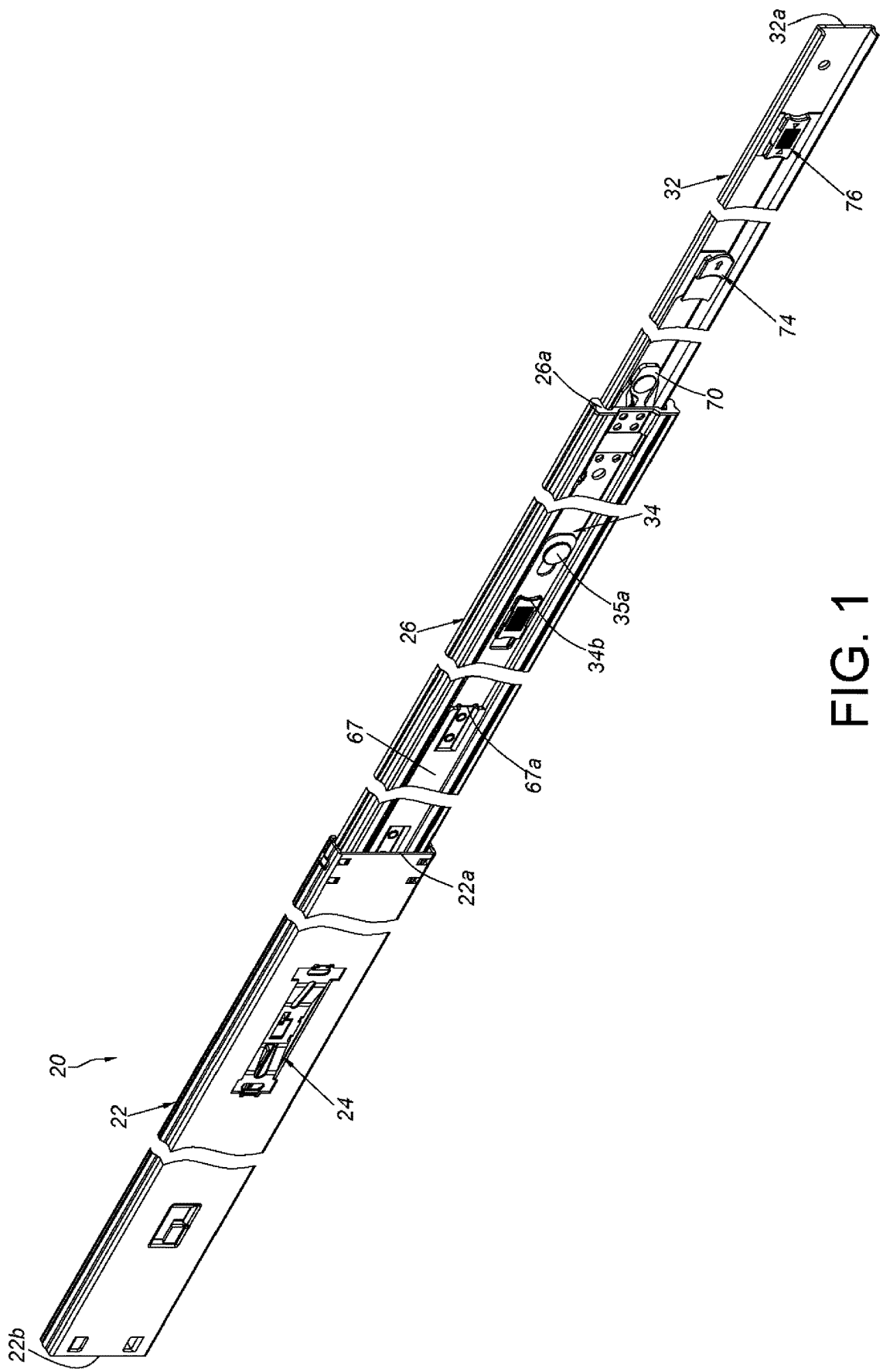
FIG. 1 is a schematic diagram illustrating a slide rail assembly at an extended status according to an embodiment of the present invention.
Figure 2:
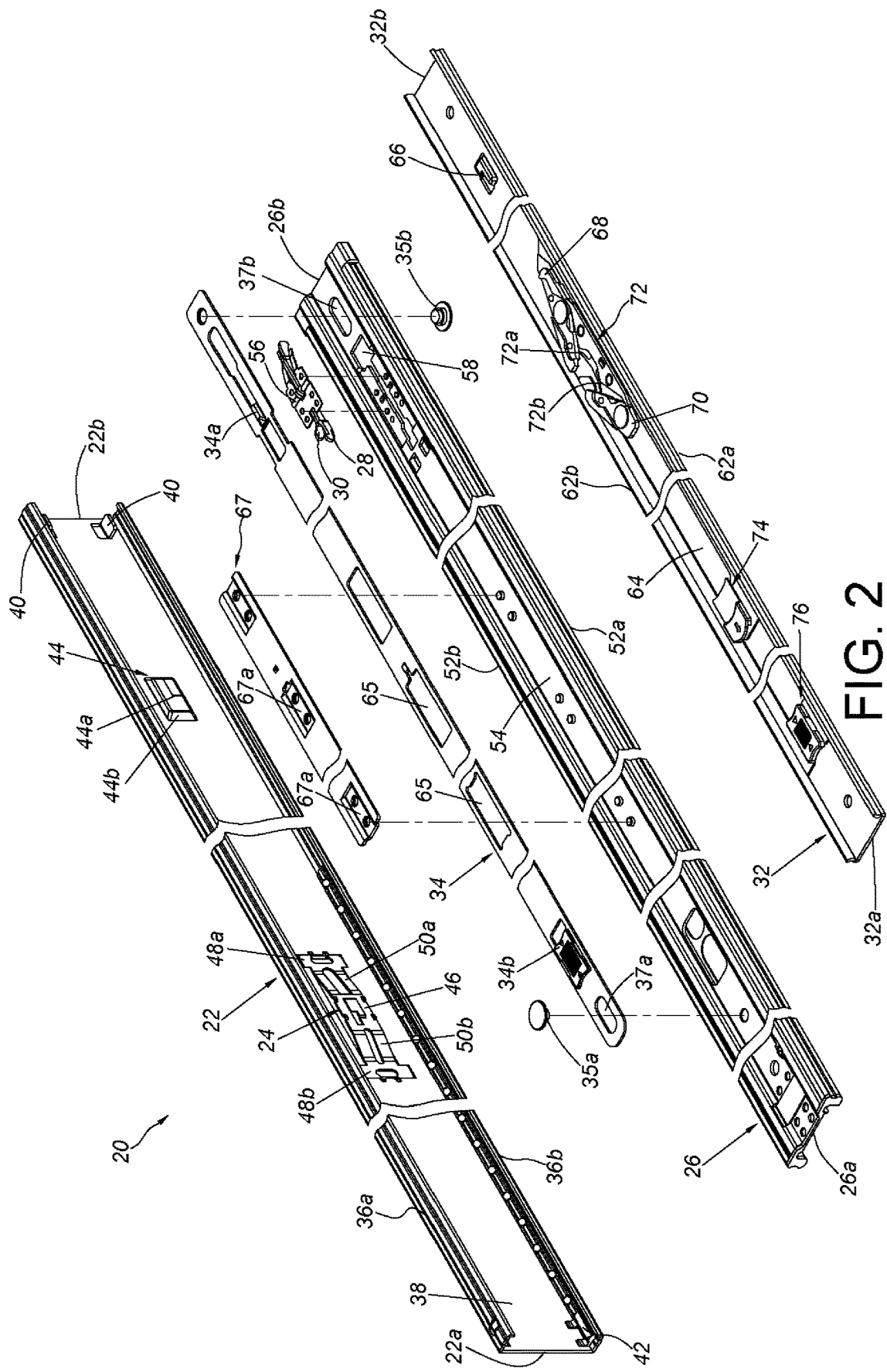
FIG. 2 is an exploded diagram illustrating the slide rail assembly according to the embodiment of the present invention.

As shown in FIGS. 1 and 2, the slide rail assembly 20 of the embodiment of the present invention comprises a first rail 22, an engaging member 24, a second rail 26 and a locking member 28. Preferably, the slide rail assembly 20 further comprises a synchronizing member 30, a third rail 32 and an operating member 34. Wherein, the second rail 26 is movably mounted between the first rail 22 and the third rail 32.

The first rail 22 has a front end 22a and a rear end 22b. Furthermore, the first rail 22 comprises a first wall 36a, a second wall 36b and a longitudinal wall 38 connected between the first wall 36a and the second wall 36b of the first rail 22. The first wall 36a, the second wall 36b and the longitudinal wall 38 of the first rail 22 cooperatively define a first channel for mounting the second rail 26. Preferably, a rear blocking portion 40 and a front blocking portion 42 is arranged on the first rail 22 adjacent to the rear end 22b and the front end 22a, respectively, to restrict the movement of the second rail 26 within a limited range relative to the first rail 22. Preferably, the first rail 22 further comprises a blocking feature 44, a protrusion is illustrative of an example of the blocking feature 44 hereinafter, but the present invention is not limited thereto. The blocking feature 44 comprises a blocking portion 44a.

The engaging member 24 is arranged on the longitudinal wall 38 of the first rail 22. The engaging member 24 comprises a resilient portion 46. Preferably, the engaging member 24 further comprises a first connecting portion 48a and a second connecting portion 48b fixedly mounted on (such as abutting against) the longitudinal wall 38 of the first rail 22, and the resilient portion 46 is connected between the first connecting portion 48a and the second connecting portion 48b. Preferably, the engaging member 24 further comprises a first guiding portion 50a and a second guiding portion 50*b*, and two ends of the resilient portion 46 are connected to the first connecting portion 48*a* and the second connecting portion 48*b* via the first guiding portion 50*a* and the second guiding portion 50*b*, respectively. Preferably, the first connecting portion 48*a* and the second connecting portion 48*b* are fixedly connected to the longitudinal wall 38 of the first rail 22 by abutting against the longitudinal wall 38; additionally, the first guiding portion 50*a* and the second guiding portion 50*b* have sloped or curved surfaces.

The second rail 26 is movably mounted between the first rail and the third rail 32. The second rail 26 is able to move longitudinally relative to the first rail 22. The second rail 26 has a front end 26*a* and a rear end 26*b*. Furthermore, the second rail 26 comprises a first wall 52*a*, a second wall 52*b* and a longitudinal wall 54 connected between the first wall 52*a* and the second wall 52*b* of the second rail 26. The first wall 52*a*, the second wall 52*b* and the longitudinal wall 54 of the second rail 26 cooperatively define a second channel for mounting the third rail 32.

Figure 4:
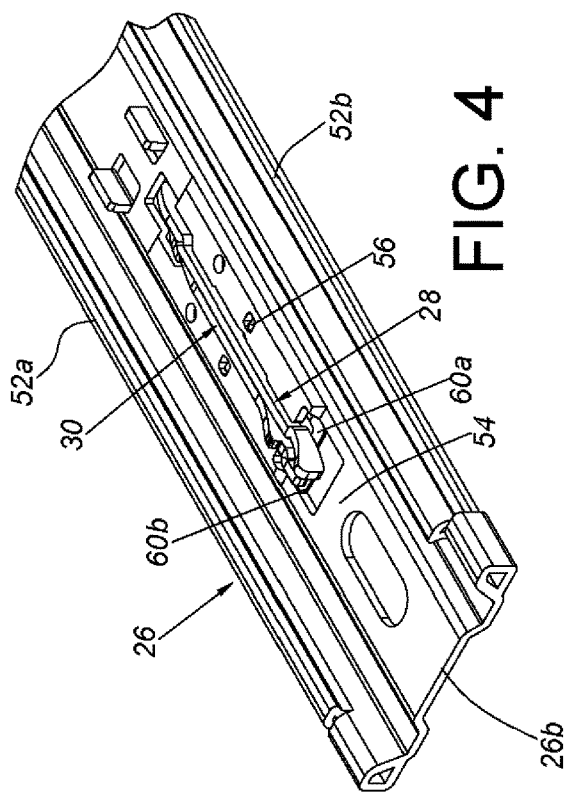
FIG. 4 is a diagram illustrating the second rail assembled with the relevant parts of the slide rail at a view angle according to the embodiment of the present invention.
Figure 5:
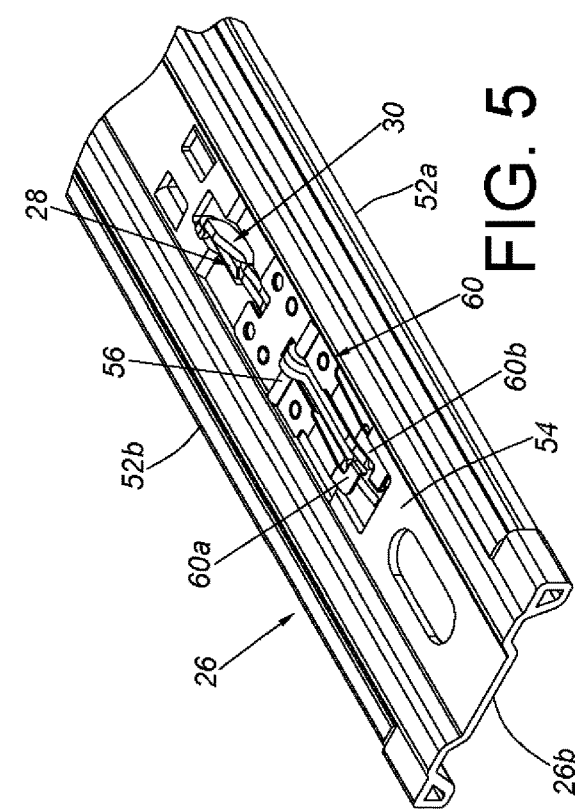
FIG. 5 is a diagram illustrating the second rail assembled with the relevant parts of the slide rail at another view angle according to the embodiment of the present invention.
Figure 3:
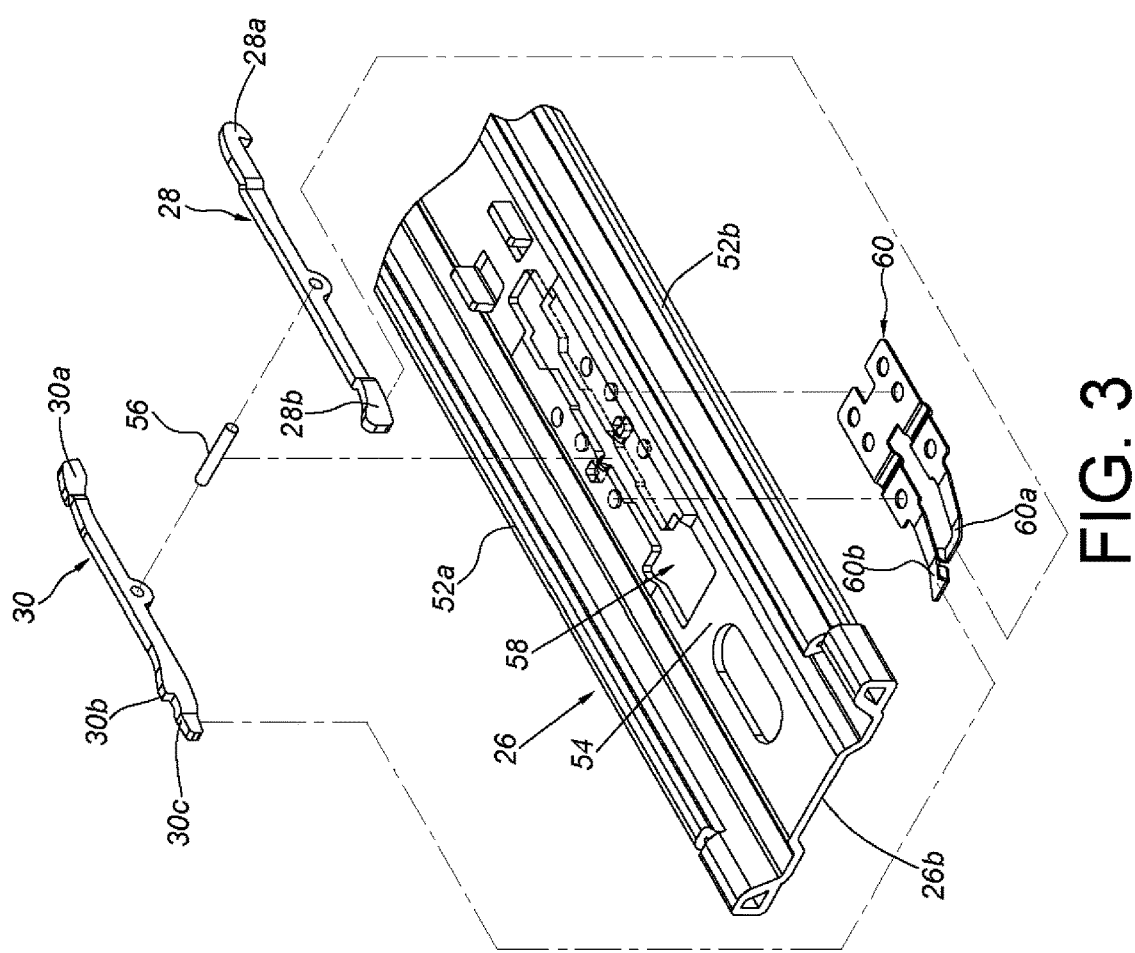
FIG. 3 is an exploded diagram illustrating the second rail and relevant parts of a slide rail according to the embodiment of the present invention.

The locking member 28 and the synchronizing member 30 are movably mounted on the second rail 26 (please also refer to FIGS. 3, 4, and 5). The locking member 28 and the synchronizing member 30 are pivotally connected to the second rail 26; here, the locking member 28 and the synchronizing member 30 being pivotally connected to the longitudinal wall 54 of the second rail 26 via a common axis 56 is illustrative of an example. Wherein, two ends of the axis 56 are pointing toward the first wall 52*a* and the second wall 52*b* of the second rail 26, and the longitudinal wall 54 of the second rail 26 has an opening 58 passing through two sides of the second rail 26. Positions of the locking member 28 and the synchronizing member 30 match a position of the opening 58. Wherein, two ends of the locking member 28 are disposed with a locking portion 28*a* and an unlocking portion 28*b*, and a middle portion of the locking member 28 is pivotally connected to the axis 56. Two ends of the synchronizing member 30 are disposed with a first contacting portion 30*a* and a second contacting portion 30*b*, and a middle portion of the synchronizing member 30 is also pivotally connected to the axis 56. Preferably, the slide rail assembly 20 further comprises a resilient member 60 attached to the second rail 26, and the resilient member 60 has a first resilient leg 60*a* and a second resilient leg 60*b* respectively providing an elastic force to the locking member 28 and the synchronizing member 30. Preferably, the resilient member 60 is fixedly connected to the longitudinal wall 54 of the second rail 26, and the first resilient leg 60*a* and the second resilient leg 60*b* are tilted at a predetermined angle relative to the longitudinal wall 54. Preferably, the first resilient leg 60*a* provides an elastic force and abuts a part of the locking member 28 adjacent to the unlocking portion 28*b*, whereas the second resilient leg 60*b* provides an elastic force and abuts a part of the synchronizing member 30 adjacent to second contacting portion 30*b*.

The third rail 32 is able to move longitudinally relative to the second rail 26. The third rail 32 has a front end 32*a* and a rear end 32*b*. Furthermore, the third rail 32 has a first wall 62*a*, a second wall 62*b* and a longitudinal wall 64 connected between the first wall 62*a* and the second wall 62*b* of the third rail 32. Additionally, the third rail 32 has a corresponding feature 66 that works in tandem with the synchronizing member 30. A protrusion is illustrative of an example of the corresponding feature 66 herein, but the invention is not limited thereto.

Figure 12:
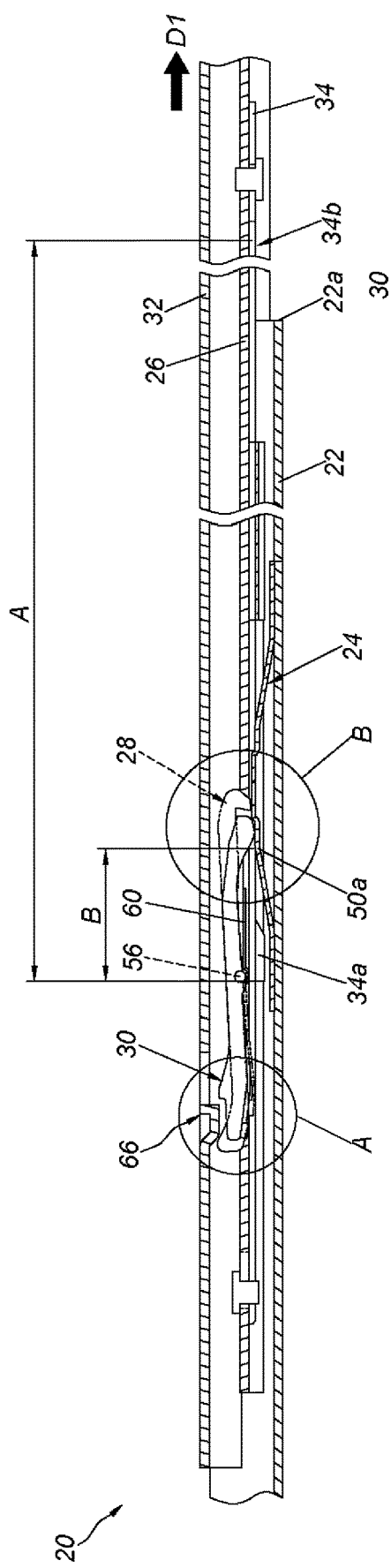
FIG. 12 is a diagram according to the embodiment of the present invention illustrating the second rail and the third rail of the slide rail assembly moving in the first direction relative to the first rail, wherein the second rail and the third rail are no longer moving synchronously.

The operating member 34 is arranged on the second rail 26. Preferably, the operating member 34 is movably mounted to a side of the longitudinal wall 54 of the second rail 26 (such as being movably mounted to a side facing the first rail 22). Preferably, the operating member 34 has a longitudinal length, and the operating member 34 comprises an unlocking feature 34*a* and an operating portion 34*b*, wherein the operating portion 34*b* and the unlocking feature 34*a* has a predetermined longitudinal distance A therebetween (as shown in FIG. 12). A protrusion is illustrative of an example of the unlocking feature 34*a*, but the invention is not limited thereto. Preferably, the operating member 34 and the second rail 26 moves longitudinally relative to each other through a coordinated arrangement of a plurality of mounting members and a plurality of longitudinal guiding slots. For example, a first mounting member 35*a* is passed through a part of a first longitudinal guiding slot 37*a* of the operating member 34 and connected to the second rail 26 (please also refer to FIG. 9); a second mounting member 35*b* is passed through a part of a second longitudinal guiding slot 37*b* of the second rail 26*a* and connected to the operating member 34 (please also refer to FIG. 7); in this manner, the operating member 34 can move within a limited range relative to the second rail 26. In the present embodiment, the first longitudinal guiding slot 37*a* is disposed on the operating member 34, and the second longitudinal guiding slot 37*b* is disposed on the second rail 26; however the present invention is not limited thereto. For example, the first longitudinal guiding slot 37*a* can also be disposed on the second rail 26, and the second longitudinal guiding slot 37*b* can also be disposed on the operating member 34. Alternatively, the first longitudinal guiding slot 37*a* and the second longitudinal guiding slot 37*b* can both be disposed on the operating member 34; or the first longitudinal guiding slot 37*a* and the second longitudinal guiding slot 37*b* can both be disposed on the second rail 26, depending on practical demands.

Preferably, the slide rail assembly 20 further comprises a reinforcing member 67. The reinforcing member 67 is connected to the longitudinal wall 54 of the second rail 26. Preferably, the reinforcing member 67 has at least a protruding portion 67*a* that corresponds to and passes through at least one mounting opening 65 of the operating member 34, and at least one protruding portion 67*a* is connected to (for example, fixedly connected to) the longitudinal wall 54 of the second rail 26. Wherein, a longitudinal length of the at least one protruding portion 67*a* is less than a longitudinal length of the at least one mounting opening 65. In such an arrangement, the reinforcing member 67 not only reinforces the structural strength of the second rail 26, but also improves the stability and reliability of the operating member 34 when the operating member 34 is operated.

Preferably, the slide rail assembly 20 further comprises a first working member 68, a second working member 70, a base 72, a first releasing member 74 and a second releasing member 76.

The first working member 68 and the second working member 70 are separately and movably connected to the longitudinal wall 64 of the third rail 32. The first working member 68 and the second working member 70 being pivotally connected to the longitudinal wall 64 of the third rail 32 are illustrative of an example herein. On the other hand, the base 72 comprises a first elastic portion 72*a* and a second elastic portion 72*b* that provides an elastic force to the first working member 68 and the second working member 70, respectively, so that the first working member 68 and the second working member 70 is kept at a first status/position. Additionally, the first releasing member 74 and the second releasing member 76 are operably connected to the first working member 68 and the second working member 70, so as to be operable to change the first working member 68 and the second working member 70 from the first status to another status/position.

As shown in FIG. 6, the slide rail assembly 20 is at a retracted status. Furthermore, the second rail 26 is retracted relative to the first rail 22 to a first position P1 (such as a retracted position), and the third rail 32 is retracted relative to the second rail 26.

Wherein, the resilient portion 46 of the engaging member 24 has a height K1 relative to the longitudinal wall 38 of the first rail 22, and the resilient portion 46 of the engaging member 24 has an engaging section 46a (please refer to FIG. 8). As an example, the engaging section 46a can be a wall of a hole H (or a slot), but the invention is not limited thereto. Wherein, the first guiding portion 50a and the second guiding portion 50b are adjacent to the resilient portion 46.

As shown in FIGS. 6 and 10, the locking member 28 and the synchronizing member 30 are pivotally connected to the second rail 26 via the axis 56. The first resilient leg 60a of the resilient member 60 provides an elastic force for the first resilient leg 60a to abut against a part of the locking member 28 adjacent to the unlocking portion 28b, and the locking portion 28a of the locking member 28 is offset from the blocking feature 44 of the first rail 22. On the other hand, the second resilient leg 60b of the resilient member 60 provides an elastic force for the second resilient leg 60b to abut against a part of the synchronizing member 30 adjacent to the second contacting portion 30b, so that the first contacting portion 30a of the synchronizing member 30 is tilted relative to the blocking feature 44 of the first rail 22 and offset from the blocking feature 44 of the first rail 22.

Furthermore, when the second rail 26 is at the first position P1 relative to the first rail 22, the rear blocking portion 40 of the first rail 22 is at a position that corresponds with the rear end 26b of the second rail 26, and the unlocking feature 34a of the operating member 34 has a predetermined longitudinal distance B (as shown in FIG. 12) away from the first guiding portion 50a of the engaging member 24. Additionally, when the second rail 26 is at the first position P1 relative to the first rail 22, and the third rail 32 is retracted relative to the second rail 26, the corresponding feature 66 of the third rail 32 can press against an extension portion 30c of the synchronizing member 30a adjacent to the second contacting portion 30b. In this manner, the first contacting portion 30a of the synchronizing member 30 can remain being offset from the blocking feature 44 of the first rail 22. Preferably, the extension portion 30c has a height difference from the second contacting portion 30b, and the corresponding feature 66 of the third rail 32 is at a position that allows the corresponding feature 66 to engage the second contacting portion 30b of the synchronizing member 30.

As shown in FIG. 11, the third rail 32 can drive the second rail 26 from the abovementioned first position P1 in a first direction D1 (such as an opening direction) to a second position via the synchronizing member 30. In other words, the second rail 26 can move in the first direction D1 relative to the first rail 22 from the first position P1. Furthermore, when the third rail 32 moves in the first direction D1, the corresponding feature 66 of the third rail 32 can abut against the second contacting portion 30b of the synchronizing member 30 so that the third rail 32 and the second rail 26 can move synchronously in the first direction D1 relative to the first rail 22.

Figure 14:
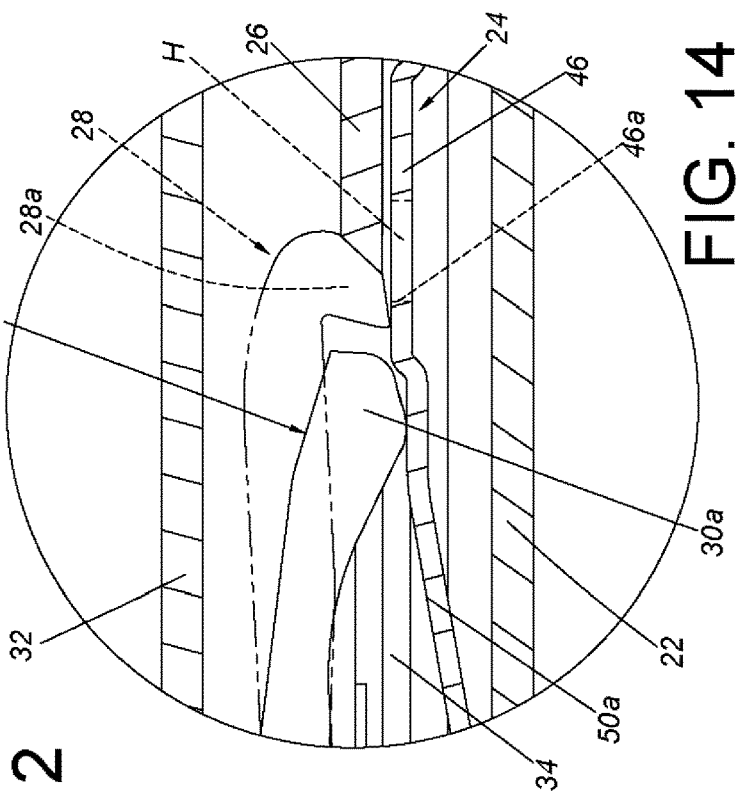
FIG. 14 is a diagram illustrating an enlarged area B of FIG. 12.
Figure 13:
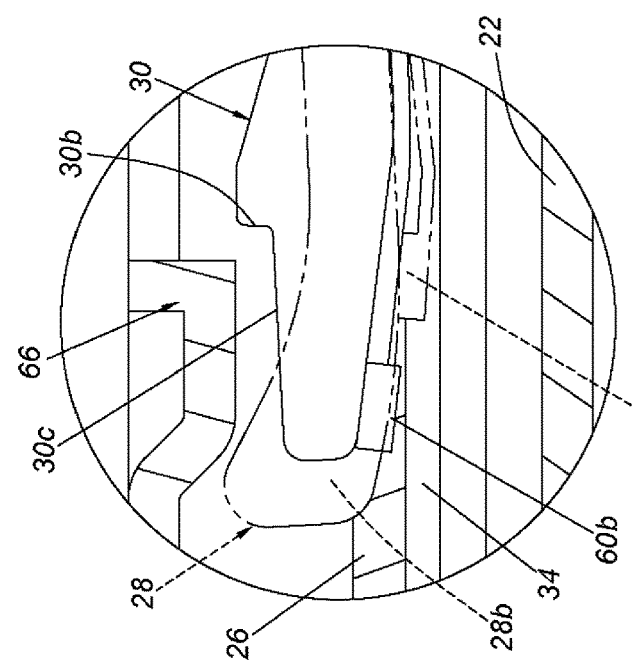
FIG. 13 is a diagram illustrating an enlarged area A of FIG. 12.

As shown in FIG. 12, when the second rail 26 is driven by the third rail 32 to move synchronously with the third rail 32 for a predetermined range, the synchronizing member 30 is driven by the guiding portion (such as the first guiding portion 50a) of the engaging member 24 such that the third rail 32 and the second rail 26 are no longer moved synchronously. For example, the synchronizing member 30 is tilted at an angle via a contact between the first contacting portion 30a and the first guiding portion 50a of the engaging member 24 (please refer to FIG. 14), such that the second contacting portion 30b of the synchronizing member 30 is no longer abutting against the corresponding feature 66 of the third rail 32 (please refer to FIG. 13), leading to the third rail 32 not being able to move synchronously with the second rail 26. Wherein, the second resilient leg 60b of the resilient member 60 stores an elastic force in response to the synchronizing member 30 being tilted at the angle (please refer to FIG. 13). On the other hand, the locking portion 28a of the locking member 28 climbs on the first guiding portion 50a of the engaging member 24 and becomes close to the engaging section 46a of the resilient portion 46 of the engaging member 24 (please refer to FIG. 14). Wherein, the locking member 28 is tilted at an angle at this time, and the first resilient leg 60a of the resilient member 60 stores an elastic force in response to the locking member 28 being tilted at the angle (please refer to FIG. 13).

As shown in FIG. 15, when the second rail 26 moves in the first direction D1 relative to the first rail 22 to arrive at the second position P2, the locking member 28 locks with the resilient portion 46 of the engaging member 24 to prevent the second rail 26 at the second position P2 from moving in a second direction (such as a retraction direction) opposite to the first direction D1. For example, in responding to the first resilient leg 60a of the resilient member 60 releasing the elastic force, the locking member 28 can enter the hole H of the engaging member 24 via the locking portion 28a and lock with the engaging section 46a of the resilient portion 46 of the engaging member 24. At this time, the second rail 26 cannot retract in the second direction relative to the first rail 22 (please refer to FIG. 16). On the other hand, the third rail 32 can move in the first direction D1 relative to the second rail 26 to an extension position (please refer to FIG. 17).

Figure 19:
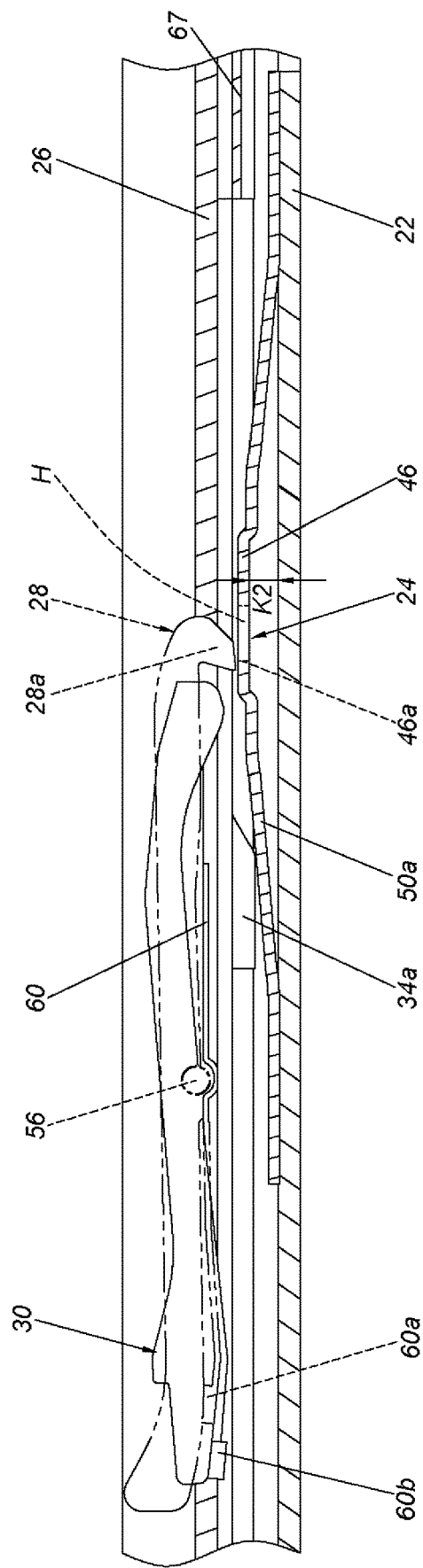
FIG. 19 is a diagram according to the embodiment of the present invention illustrating that the operating member of the slide rail assembly is operable to allow the unlocking feature to drive the engaging member, thereby releasing the lock between the second rail and the first rail.

As shown in FIGS. 15, 17 and 18, when a lock between the locking member 28 and the resilient portion 46 of the engaging member 24 is to be released, a user can operate the operating member 34, for example, by applying a force F (as shown in FIG. 15) to the operating portion 34b of the operating member 34 for the operating member 34 to move longitudinally relative to the second rail 26, and for the unlocking feature 34a of the operating member 34 to contact the first guiding portion 50a of the engaging member 24 (as shown in FIGS. 17 and 18). As the operating member 34 continues to be operated by force, a pressure from the unlocking feature 34a of the operating member 34 is exerted on the first guiding portion 50a of the engaging member 24 so that the resilient portion 46 of the engaging member 24, in response to the pressure, is driven to deform elastically from the height K1 to another lower height K2 (please refer to FIG. 19). In this manner, the engaging section 46a of the resilient portion 46 of the engaging member 24 can be released from the locking portion 28a of the locking member 28 so that the locking member 28 is no longer locked with the resilient portion 46 of the engaging member 24. In other words, the second rail 26 is allowed to move in the second direction from the second position P2.

It should be mentioned that when the second rail 26 is at the second position P2 relative to the first rail 22, not only can the user apply a force to the operating member 34 to release the lock between the locking member 28 and the resilient portion 46 of the engaging member 24, the user can use another operating method to achieve the same effect. As shown in FIG. 17, when the third rail 32 is at the extension position relative to the second rail 26, the user can also move the third rail 32 in the second direction (such as the retraction direction) opposite the first direction D1 for the rear end 32b of the third rail 32 to contact the unlocking portion 28b of the locking member 28, so that the locking portion 28a of the locking member 28 can be driven to be released from the engaging section 46a of the resilient portion 46 of the engaging member 24. The purpose of such operation is to release the lock between the locking member 28 and the resilient portion 46 of the engaging member 24, so that the second rail 26 at the second position P2 can move in the second direction relative to the first rail 22.

Figure 20:
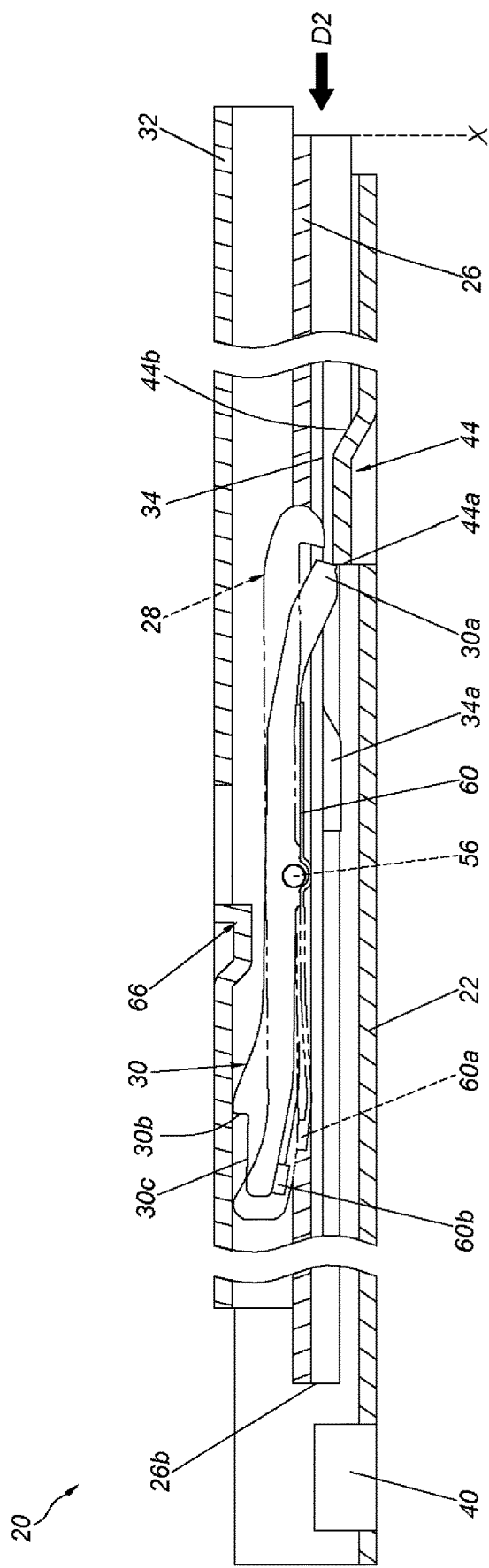
FIG. 20 is a diagram according to the embodiment of the present invention illustrating the second rail and the third rail of the slide rail assembly being retracted for a predetermined range in the second direction relative to the first rail.

As shown in FIG. 20, preferably the blocking feature 44 further comprises a guiding section 44b (a sloped surface or a curved surface are illustrative of an example of a guiding section herein) arranged opposite to or on another side of the blocking portion 44a. When the second rail 26 at the second position P2 moves in a second direction D2 to a predetermined position X close to the first position P1, the first contacting portion 30a of the synchronizing member 30 crosses over the guiding section 44b in the second direction D2. Here, the first contacting portion 30a of the synchronizing member 30 responds to the elastic force provided by the second resilient leg 60b of the resilient member 60 and enables the second rail 26 to be blocked by the blocking portion 44a of the blocking feature 44 of the first rail 22, thereby preventing the second rail 26 at the predetermined position X from moving in the first direction D1 (the opening direction) relative to the first rail 22.

As shown in FIG. 21, the second rail 26 comprises a blocking structure 27 arranged (in a fixed manner) adjacent to the front end 26a of the second rail 26. Additionally, the first working member 68 and the second working member 70 are kept at the first status S1 through the first elastic portion 72a and the second elastic portion 72b of the base 72, respectively. When the second rail 26 is at the second position P2 relative to the first rail 22, and the third rail 32 moves in the first direction D1 relative to the second rail 26 for a predetermined range of extension, the second working member 70 contacts a first side L1 of the blocking structure 27. In the present embodiment, the first elastic portion 72a and the second elastic portion 72b are disposed on the base 72, but the present invention is not limited thereto. For example, the first elastic portion 72a and the second elastic portion 72b can also be directly disposed on the third rail 32; that is, the base 72 is a component that can be omitted in the present invention.

As shown in FIG. 22, when the third rail 32 continues to move in the first direction D1 relative to the second rail 26, the second working member 70 at the first status S1 is able to tilt at an angle to a second status S2 as the second working member 70 abuts against the blocking structure 27, so that the second working member 70 can cross the first side L1 of the blocking structure 27. Here, the second elastic portion 72b of the base 72 is at a status that stores an elastic force in response to the second working member 70 being tilted at the angle.

Figure 23:
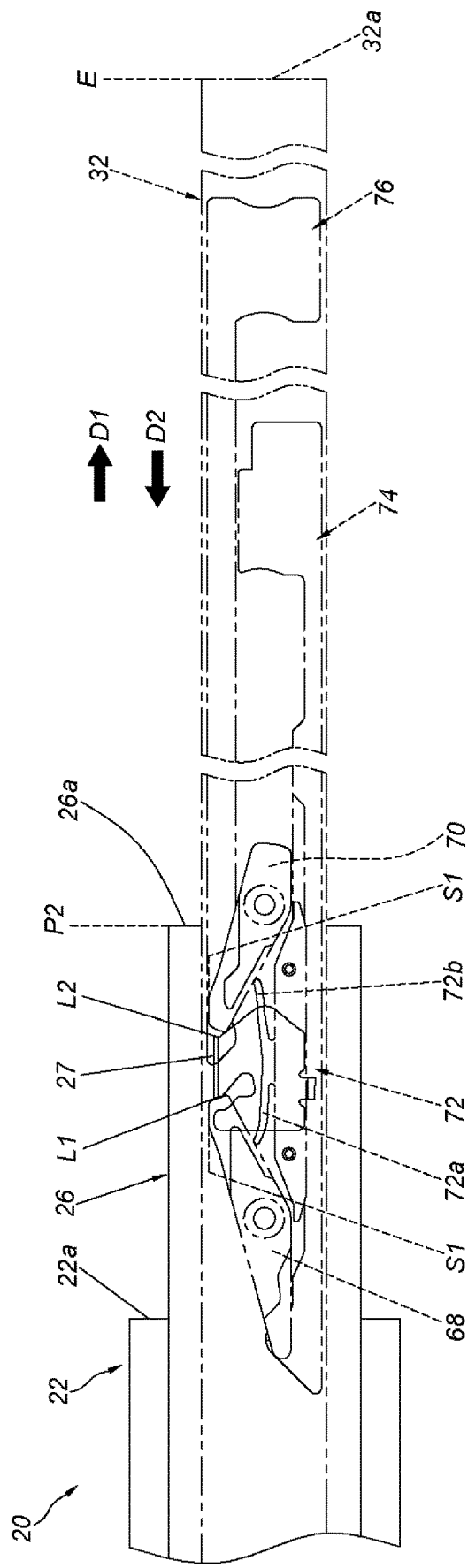
FIG. 23 is a diagram according to the embodiment of the present invention illustrating the second rail of the slide rail assembly being at the second position relative to the first rail, and the third rail being at the extension position relative to the second rail.

As shown in FIG. 23, when the third rail 32 moves even further in the first direction D1 to an extension position E relative to the second rail 26, the second working member 70 is on a second side L2 of the blocking structure and returns to the first status S1 from the second status S2 in response to the second elastic portion 72b of the base 72 releasing the stored elastic force. On the other hand, the first working member 68 is at the first status S1 and located on the first side L1 of the blocking structure 27. In other words, the first working member 68 and the second working member 70 are at the first status S1 and blocked by the blocking structure 27 on either sides of the blocking structure 27 such that the third rail 32 at the extension position E is prevented from moving in the first direction D1 or the second direction D2 relative to the second rail 26. At this time, the slide rail assembly 20 is at an extended status.

As shown in FIG. 24, when the third rail 32 at the extension position E is to be moved in the first direction D1 or the second direction D2 relative to the second rail 26, the user can use the first releasing member 74 to drive the first working member 68 from the first status S1 to the second status S2, so that the third rail 32 at the extension position E can move in the first direction D1 relative to the second rail 26; or the user can use the second releasing member 76 to drive the second working member 70 from the first status S1 to the second status S2, so that the third rail 32 at the extension position E can move in the second direction D2 relative to the second rail 26. The third rail 32 at the extension position E being able to move in the first direction D1 relative to the second rail 26 and released from the second channel of the second rail 26 is illustrative of an example herein (please refer to FIG. 25). In other words, the third rail 32 can be removed from the second rail 26.

As shown in FIGS. 26 and 27, the third rail 32 is capable of carrying a carried object 78 (such as an electronic equipment, a drawer or similar). When the slide rail assembly 20 is applied in a working environment 80, sometimes a space Y between the working environment 80 and the slide rail assembly 20 may be too narrow. Therefore, when the slide rail assembly 20 is at an extended status (such as when the second rail 26 is at the second position P2 relative to the first rail 22, and the third rail 32 is at the extension position E relative to the second rail 26), the third rail 32 may be difficult to be removed from the extension position E in the first direction D1 relative to the second rail 26. Therefore, when working in the limited space Y, the user can, for example, release the lock between the resilient portion 46 of the engaging member 24 and the locking member 28 via the operating member 34 so that the second rail 26 at the second position P2 can move or retract in the second direction D2 relative to the first rail 22 (as shown in FIG. 27) and allow the third rail 32 and the carried object 78 to be removed. In this manner, the maintenance process of the third rail 32, the carried object 78 or the slide rail assembly 20 can be improved.

As such, the slide rail assembly 20 according to the embodiment of the present invention includes the following characteristics:

1. The engaging member 24 can be seen as an elastic or resilient piece that can be operated to release a lock between the second rail 26 and the first rail 22 when the second rail 26 is at the second position P2.

2. The user can release the lock between the second rail 26 and the first rail 22 when the second rail 26 is at the second position P2 via the unlocking feature 34a of the operating member 34 or via the movement of the third rail 32 in the second direction D2 relative to the second rail 26.

3. Not only does the reinforcing member 67 reinforce the structural strength of the second rail 26, but it also improves the stability and reliability of the operating member 34 when the operating member 34 is operated.

4. When the second rail 26 is at a predetermined position X relative to the first rail 22, the second resilient leg 60b of the resilient member 60 can provide the elastic force to the synchronizing member 30 so that the synchronizing member 30 is blocked by the blocking feature 44, thereby preventing the second rail 26 at the predetermined position X from moving in the first direction D1. That is to say, when the third rail 32 is removed in the first direction D1, the second rail 26 will not extend or move in the first direction D1, in order for the slide rail assembly 20 to be used within the narrow space.

5. A user can drive the first working member 68 to change from the first status S1 to the second status S2 via the first releasing member 74, so that the third rail 32 at the extension position E can move in the first direction D1 relative to the second rail 26 and be removed from the second rail 26.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly comprising:
a first rail;
an engaging member arranged on the first rail, the engaging member comprising a resilient portion;
a second rail movable relative to the first rail;
a locking member movably mounted on the second rail;
a third rail movable relative to the second rail, and
an operating member arranged on the second rail;
wherein, when the second rail moves from a first position to a second position in a first direction relative to the first rail, the locking member is used to lock with the resilient portion of the engaging member such that the second rail at the second position is prevented from moving in a second direction opposite to the first direction;
wherein the engaging member and the operating member are arranged between the first rail and the second rail;
wherein, when the second rail is at the second position, the operating member is operated to drive the resilient portion of the engaging member such that the locking member does not lock with the resilient portion of the engaging member.

2. The slide rail assembly of claim 1, wherein the first rail comprises a first wall, a second wall, and a longitudinal wall connected between the first wall and the second wall of the first rail, and the resilient portion of the engaging member has a height relative to the longitudinal wall of the first rail.

3. The slide rail assembly of claim 2, wherein the engaging member further comprises a first connecting portion and a second connecting portion mounted on the longitudinal wall of the first rail, the resilient portion is connected between the first connecting portion and the second connecting portion, the engaging member further comprises a first guiding portion and a second guiding portion, and two ends of the resilient portion are connected to the first connecting portion and the second connecting portion via the first guiding portion and the second guiding portion, respectively.

4. The slide rail assembly of claim 3, further comprising a synchronizing member and a third rail, the synchronizing member being movably mounted to the second rail, and the third rail being movable relative to the second rail; wherein the third rail is able to drive the second rail from the first position to the second position via the synchronizing member; wherein when the second rail is driven for a predetermined range, the synchronizing member is driven via the first guiding portion adjacent to the resilient portion of the engaging member such that the third rail and the second rail do not move synchronously.

5. The slide rail assembly of claim 4, further comprising an operating member arranged on the second rail; wherein, when the second rail is at the second position, the operating member is operated to drive the resilient portion of the engaging member such that the locking member does not lock with the resilient portion of the engaging member.

6. The slide rail assembly of claim 4, wherein the locking member and the synchronizing member are pivotally connected to the second rail, the slide rail assembly further comprises a resilient member attached to the second rail, and the resilient member has a first resilient leg and a second resilient leg providing an elastic force to the locking member and the synchronizing member, respectively.

7. The slide rail assembly of claim 6, wherein the first rail further comprises a blocking feature, and when the second rail is at a predetermined position relative to the first rail, the second resilient leg is able to provide the elastic force to the synchronizing member such that the synchronizing member is blocked by the blocking feature, thereby preventing the second rail at the predetermined position from moving in the first direction.

8. The slide rail assembly of claim 4, wherein the third rail has a corresponding feature, and the corresponding feature of the third rail is used to engage the synchronizing member.

9. The slide rail assembly of claim 4, wherein the second rail comprises a blocking structure, and the slide rail assembly further comprises a working member movably mounted to the third rail; wherein when the second rail is at the second position and the third rail moves in the first direction to an extension position relative to the second rail, the working member is at a first status and located on a side of the blocking structure to prevent the third rail from moving in the first direction.

10. The slide rail assembly of claim 9, further comprising a base having an elastic portion that provides an elastic force to keep the working member at the first status, and a releasing member operably connected to the working member, wherein the releasing member is used to drive the working member from the first status to a second status so that the third rail at the extension position is allowed to move in the first direction and be removed from the second rail.

11. A slide rail assembly, comprising:
a first rail;
an engaging member arranged on the first rail, the engaging member comprising a resilient portion and a guiding portion;
a second rail movable relative to the first rail;
a locking member and a synchronizing member pivotally connected to the second rail via a common axis;
a third rail movable relative to the second rail; and
an operating member arranged on the second rail;
wherein the engaging member and the operating member are arranged between the first rail and the second rail;
wherein the third rail is able to drive the second rail from a first position to a second position in a first direction via the synchronizing member;
wherein when the second rail is driven for a predetermined range, the synchronizing member is driven via the guiding portion of the engaging member such that the third rail and the second rail do not move synchronously, and when the second rail is at the second position, the locking member is used to lock with the resilient portion of the engaging member;

wherein, when the second rail is at the second position, the operating member is operated to drive the resilient portion of the engaging member such that the locking member does not lock with the resilient portion of the engaging member.

12. The slide rail assembly of claim 11, further comprising a resilient member attached to the second rail, the resilient member having a first resilient leg and a second resilient leg providing an elastic force to the locking member and the synchronizing member, respectively.

13. The slide rail assembly of claim 12, wherein the first rail further comprises a blocking feature, and when the second rail is at a predetermined position relative to the first rail, the second resilient leg is able to provide the elastic force to the synchronizing member such that the synchronizing member is blocked by the blocking feature, thereby preventing the second rail at the predetermined position from moving in the first direction.

14. The slide rail assembly of claim 13, wherein the third rail has a corresponding feature, and the corresponding feature of the third rail is used to engage the synchronizing member.

15. The slide rail assembly of claim 11, wherein the first rail comprises a first wall, a second wall, and a longitudinal wall connected between the first wall and the second wall of the first rail, and the resilient portion of the engaging member has a height relative to the longitudinal wall of the first rail.

16. The slide rail assembly of claim 15, wherein the engaging member further comprises a first connecting portion and a second connecting portion mounted on the longitudinal wall of the first rail, and the resilient portion is connected between the first connecting portion and the second connecting portion.

17. The slide rail assembly of claim 16, wherein the engaging member further comprises a first guiding portion and a second guiding portion, and two ends of the resilient portion are connected to the first connecting portion and the second connecting portion through the first guiding portion and the second guiding portion, respectively.

18. The slide rail assembly of claim 11, wherein the second rail comprises a blocking structure, and the slide rail assembly further comprises a working member movably mounted to the third rail; wherein when the second rail is at the second position and the third rail moves in the first direction to an extension position relative to the second rail, the working member is at a first status and located on a side of the blocking structure to prevent the third rail from moving in the first direction; the slide rail assembly further comprises a base having an elastic portion that provides an elastic force to keep the working member at the first status and a releasing member operably connected to the working member, wherein the releasing member is used to drive the working member from the first status to a second status.

* * * * *